(12) United States Patent
Fang et al.

(10) Patent No.: US 8,679,938 B2
(45) Date of Patent: Mar. 25, 2014

(54) SHALLOW TRENCH ISOLATION FOR DEVICE INCLUDING DEEP TRENCH CAPACITORS

(75) Inventors: Sunfei Fang, LaGrangeville, NY (US); Oleg Gluschenkov, Tannersville, NY (US); Byeong Y. Kim, LaGrangeville, NY (US); Rishikesh Krishnan, Poughkeepsie, NY (US); Daewon Yang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 13/366,576

(22) Filed: Feb. 6, 2012

(65) Prior Publication Data

US 2013/0200482 A1    Aug. 8, 2013

(51) Int. Cl.
*H01L 21/20* (2006.01)

(52) U.S. Cl.
USPC ............ 438/391; 257/E21.008; 257/E21.54; 257/E21.545; 257/E21.642; 438/196; 438/207; 438/218; 438/219; 438/221; 438/243; 438/248; 438/296; 438/353; 438/386

(58) Field of Classification Search
USPC ............ 257/E21.008, E21.54, E21.545, 257/E21.642; 438/196, 207, 218, 219, 221, 438/243, 248, 296, 353, 386, 391, 400
See application file for complete search history.

(56) References Cited

U.S. PATENT DOCUMENTS

| | | | |
|---|---|---|---|
| 6,051,478 A | 4/2000 | Ibok | |
| 6,153,480 A | 11/2000 | Arghavani et al. | |
| 6,734,082 B2 | 5/2004 | Zheng et al. | |
| 7,022,584 B2 | 4/2006 | Iinuma | |
| 7,118,987 B2 | 10/2006 | Fu et al. | |
| 7,199,020 B2 | 4/2007 | Mehrotra et al. | |
| 7,361,572 B2 | 4/2008 | Chen et al. | |
| 7,902,628 B2 | 3/2011 | Lim et al. | |
| 2004/0043581 A1* | 3/2004 | Lin et al. | 438/437 |
| 2005/0142797 A1 | 6/2005 | Ahn | |
| 2006/0186509 A1 | 8/2006 | Larsen | |
| 2009/0236691 A1* | 9/2009 | Dyer et al. | 257/532 |
| 2012/0190211 A1* | 7/2012 | Ueda et al. | 438/778 |

FOREIGN PATENT DOCUMENTS

JP    6163517    6/1994

* cited by examiner

*Primary Examiner* — Asok K Sarkar
(74) *Attorney, Agent, or Firm* — Cantor Colburn LLP; Matthew Zehrer

(57) ABSTRACT

A method for formation of a shallow trench isolation (STI) in an active region of a device comprising trench capacitive elements, the trench capacitive elements comprising a metal plate and a high-k dielectric includes etching a STI trench in the active region of the device, wherein the STI trench is directly adjacent to at least one of the metal plate or high-k dielectric of the trench capacitive elements; and forming an oxide liner in the STI trench, wherein the oxide liner is formed selectively to the metal plate or high-k dielectric, wherein forming the oxide liner is performed at a temperature of about 600° C. or less.

20 Claims, 4 Drawing Sheets

```
┌─────────────────────────┐     ┌─────────────────────────┐     ┌─────────────────────────┐
│ ETCH STI TRENCHES       │     │ FORM OXIDE LINERS IN    │     │ DEPOSIT OXIDE FILL IN   │
│ BETWEEN METALLIC        │ ──▶ │ STI TRENCHES BY LOW     │ ──▶ │ LINED STI TRENCHES TO   │
│ CAPACITIVE ELEMENTS     │     │ TEMPERATURE SELECTIVE   │     │ FORM STI REGIONS USING  │
│ IN ACTIVE REGION OF     │     │ OXIDATION               │     │ OPTIONAL OXYGEN DELAY   │
│ DEVICE                  │     │          102            │     │ DEPOSITION TECHNIQUE    │
│          101            │     │                         │     │          103            │
└─────────────────────────┘     └─────────────────────────┘     └─────────────────────────┘
```

SHALLOW TRENCH ISOLATION FOR DEVICE INCLUDING DEEP TRENCH CAPACITORS

BACKGROUND

This disclosure relates generally to the field of shallow trench isolation (STI) regions that are formed between electrical components on a wafer, and more particularly to STI regions for devices that include trench-based capacitors comprising high-k dielectric and metal plate.

DRAM memory cells include two main components: a storage capacitor, which stores a charge, and an access transistor, which transfers charge to and from the capacitor. The communication between the storage capacitor and the access transistor is controlled by a select signal, commonly referred to as a word line, that connects one plate of the capacitor to a data line, commonly referred to as a bit line. The storage capacitor is typically located in a deep trench that is etched into a wafer comprising a semiconductor substrate. The deep trench design enables a large amount of charge to be stored in a relatively small chip surface area.

Conventional DRAM arrays are organized so that multiple storage cells are positioned as closely as possible to one another. During the operation of the DRAM array, individual memory cells are selected by energizing of the associated word line, causing each of the selected cells to communicate their contents to sense amplifiers by way of their respective associated bit lines. In order for the DRAM array to function properly, it is essential to electrically isolate the memory cells from one another. Since current research is directed toward a greater density of memory cells per unit of semiconductor substrate, effective isolation means is important.

Performance of DRAM arrays is related to the speed of data access and data writing, and to the power consumption of the DRAM. The power consumption is dependent on the rate at which stored data need to be refreshed due to a gradual loss of stored charge from the storage capacitors through various leakage mechanisms or leakage currents. Data read and write speeds are affected by the parasitic resistance of various elements that may slow down charge transfer to and from the storage capacitors. As the memory density increases, the parasitic resistance rises, causing a drop in performance. Similarly, the storage capacitance and amount of stored charge decreases for scaled down cells, forcing faster data refresh rates and increased power consumption. The use of low-resistance and high-dielectric-constant materials provides means for alleviating the performance drop in scaled down cells.

Embedded DRAM arrays (eDRAM) are conventional DRAM arrays built alongside a fast-switching logic circuitry, allowing for vast amounts of memory to be placed in immediate proximity to high-speed microprocessor cores and other logic elements, collective referred to as logic. The eDRAM microstructure and fabrication processes should be compatible with the logic microstructures and fabrication processes. More specifically, a trench-based eDRAM microstructure must be able to withstand exposure to thermal steps that may be used in a logic fabrication process without adverse effects in the eDRAM.

Trench-based capacitors are also used as decoupling capacitors in various types of integrated circuits (ICs). Individual trench-based capacitors may be arranged into regular arrays, similar to those that are used in DRAM cells, but without access transistors. Such decoupling capacitor arrays allow for a large capacitance to be packed in relatively small chip area providing increased noise immunity in chip power and ground lines.

Such trench-based capacitors may be isolated by shallow trench isolation (STI) regions that are formed between the deep trench capacitors. An STI region is a vertical trench that is etched into an electrically active portion of a wafer and filled with oxide. A liner is typically formed in an STI trench after the trench is etched to smooth the interior and the corners of the STI trench. Another purpose of the liner is to provide a high-quality isolation-semiconductor interface with low density of mid-gap states ($D_{it}$), to ensure a low leakage current in the transistor off state and better reliability with reduced hot carrier effects. Since higher temperature oxidation processes are known for low-$D_{it}$ interfaces and corner rounding effects, formation of the liner is typically a high temperature process (for example, over 900° C.). The formation of STI oxide fill may also be performed at a relatively high temperature.

During formation of the oxide-filled STI regions, including the liner, in a wafer that includes deep-trench capacitors, low-resistance and high-dielectric-constant materials that make up the capacitors may be oxidized. Oxidized materials cause higher parasitic series resistance and structural defects in the adjacent substrate. Higher series resistance reduces memory performance. Structural defects result in electrical leakage between memory elements and may also interact with downstream thermal steps causing permanent wafer distortion and warping, which may degrade the quality of the lithography overlay between subsequent printed layers reducing yield of the manufacturing process.

BRIEF SUMMARY

In one aspect, a method for formation of a shallow trench isolation (STI) region in an active region of a device comprising trench capacitive elements, the trench capacitive elements comprising a metal plate and a high-k dielectric includes etching a STI trench in the active region of the device, wherein the STI trench is directly adjacent to at least one of the metal plate or high-k dielectric of the trench capacitive elements; forming an oxide liner in the STI trench, wherein the oxide liner is formed selectively to the metal plate or high-k dielectric, wherein forming the oxide liner is performed at a temperature of about 600° C. or less; and forming an oxide fill over the oxide liner in the STI trench to form the STI region.

In another aspect, a method for formation of a shallow trench isolation (STI) region in an active region of a device comprising trench capacitive elements, the trench capacitive elements comprising a metal plate and a high-k dielectric includes etching a STI trench in the active region of the device, wherein the STI trench is directly adjacent to at least one of the metal plate or high-k dielectric of the trench capacitive elements; and forming an oxide fill in the STI trench using an oxidizing precursor delay deposition technique including exposing the STI trench to a first non-oxidizing precursor for a delay time period, wherein a first fill layer is formed in the STI trench by the first non-oxidizing precursor; and after elapsing of the delay time period, mixing an oxidizing precursor with the first non-oxidizing precursor to selectively oxidize the first fill layer and to deposit the oxide fill.

In another aspect, a shallow trench isolation (STI) region located in an active region of a device comprising trench capacitive elements, the trench capacitive elements comprising a metal plate and a high-k dielectric includes a STI trench located in the active region of the device directly adjacent to at least one of the metal plate or high-k dielectric of the trench capacitive elements; an oxide liner located on a wall of STI trench, and an oxide fill located in the STI trench over the oxide liner.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIG. 1 is a flowchart illustrating an embodiment of a method for STI region formation for a device including deep trench capacitors.

DETAILED DESCRIPTION

Figure 2:
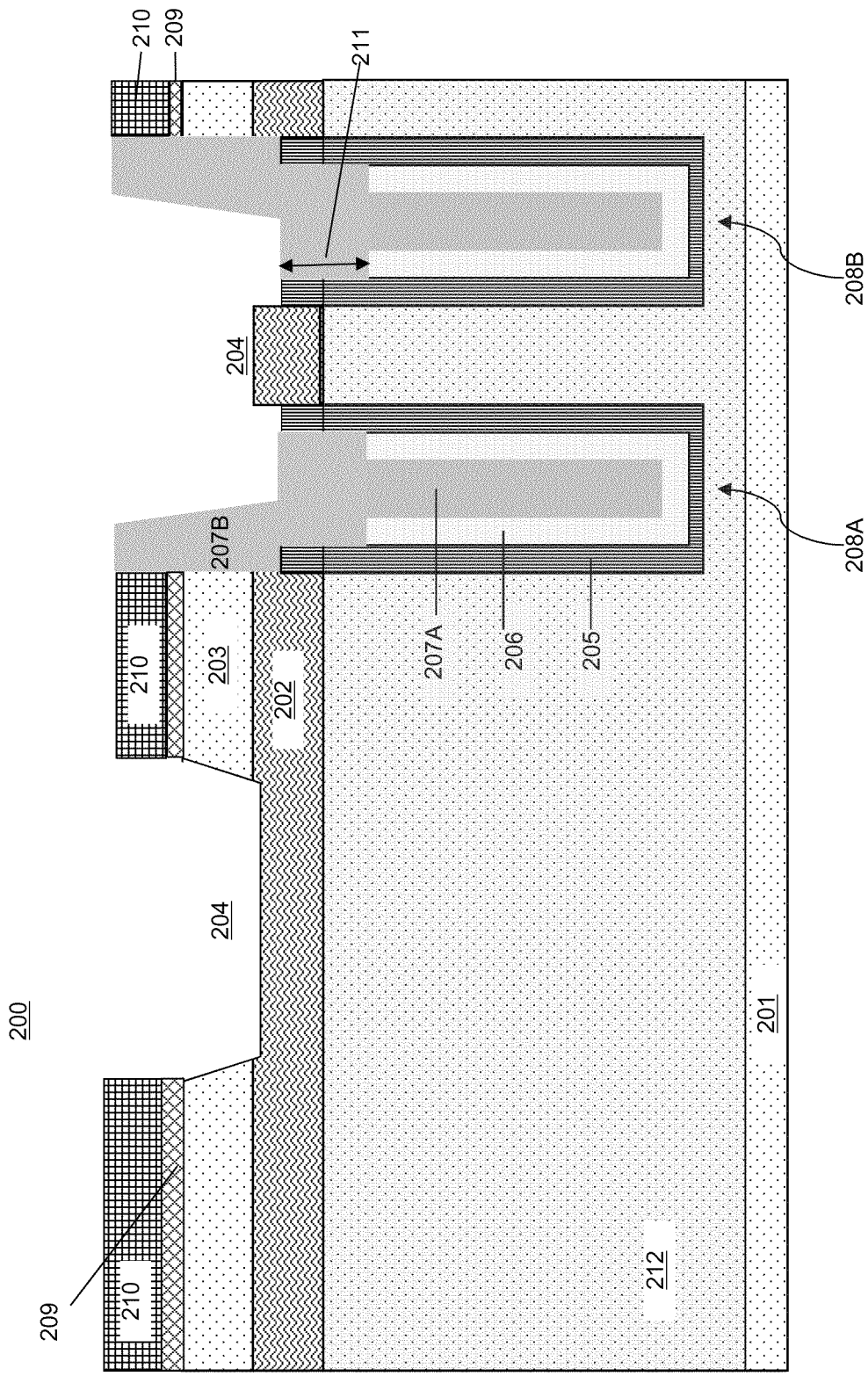
FIG. 2 is a cross-sectional view illustrating an embodiment of a DRAM device including deep trench capacitors after formation of STI trenches.

Embodiments of STI regions for a device including deep trench capacitors, and methods of forming STI regions for a device including deep trench capacitors, are provided, with exemplary embodiments being discussed below in detail. To continue DRAM scaling (i.e., further reduce area per unit memory cell, increase speed of memory cell operation, and maintain the amount of stored charge), the deep trench storage capacitors may include high-k deep trench node dielectric material and metal plate(s) that act as one or both electrodes of the storage capacitor. In a DRAM device that includes such capacitive elements with metal plate, oxidation of the metal plate material during STI region formation may be reduced by forming the STI liner using selective oxidation at a relatively low temperature. Such STI region formation techniques may also be used in conjunction with devices including deep-trench decoupling capacitors.

Selective oxidation for STI liner formation may be performed using a mixture of oxidizing and reducing gases. In such mixture, the speed of silicon oxidation chemical reaction is faster than the speed of the silicon oxide reduction reaction at edge of active Si area exposed by STI, while the speed of chemical reduction is faster than the speed of its oxidation at metal plate. The selective oxidation gas mixture may include from about 1% to about 20% of an oxidizing gas such as oxygen ($O_2$), water ($H_2O$), nitrous oxide ($N_2O$), or ozone ($O_3$), and from about 80% to about 99% of a reducing gas such as hydrogen ($H_2$), ammonia ($NH_3$), and silane ($SiH_4$). The selective oxidation mixture may be also diluted by addition of a neutral carrier gas such as Argon (Ar), Helium (He), Neon (Ne), Xeon (Xe), or Nitrogen ($N_2$). The selective oxidation mixture may be excited in plasma for electrical discharge to form oxygen and hydrogen radicals that promote fast oxidation and reduction chemical reactions at lower process temperatures. The plasma excitation may be performed remotely or in the process chamber. The temperature of the selective oxidation process is selected to provide desired oxidation selectivity with respect to the metallic materials that comprise the deep trench capacitors. For an example device including deep trench capacitors including tungsten and tungsten nitride materials, the selectivity is achieved only at high temperatures of above about 800° C. for a thermal, non-plasma process, whereas in the case of a deep trench capacitor with a metal plate regions such as titanium nitride (TiN), a plasma-assisted selective oxidation may be performed at a temperature of about 600° C. or below. In some embodiments, the STI liner may be annealed after formation in a neutral ambient (for example, $N_2$) at a temperature about 800° C. or higher to further improve interfacial quality.

In some additional embodiments, the oxide fill that is deposited over the STI liner in the STI regions may be formed using an oxidation delay deposition technique, which further reduces oxidation of the metal plate and metal fill regions of the deep trench capacitors. STI structures formed using these techniques demonstrate a low resistance of metal fill elements, reduced amount of structural defects, reduce substrate distortion and warping, and have improved lithography overlay quality, improving the yield of the device manufacturing process. Such STI structures may be subjected to multiple millisecond-range anneals without experiencing significant wafer distortion.

Typical metal plate for use in a deep trench capacitor include transitional metal nitrides and metal-silicon-nitrides, which are thermally stable and can be uniformly deposited into the deep trenches. Examples of such transitional metal nitride metallic materials include titanium nitride (TiN), tantalum nitride (TaN), tungsten nitride (WN), and hafnium nitride (HfN), and transitional metal-silicon-nitride alloys include tantalum silicon nitride (TaSiN), tungsten silicon nitride (WSiN), and hafnium silicon nitride (HfSiN). The plate electrode material may comprise a doped semiconductor material such as doped silicon and other group IV element alloys (e.g silicon germanium, or SiGe), and may also include the above-listed transitional metal-nitrides and/or their silicon containing alloys, including thermally stable transitional metal silicides such as $TaSi_x$, $WSi_x$, $MoSi_x$, and $TiSi_x$. In an exemplary embodiment, the metal plate is TiN, and the plate electrode material is highly doped silicon. The temperature and gases used in the selective oxidation process are selected to provide desired oxidation selectivity with respect to the various metallic materials that comprise the deep trench capacitors.

Turning to FIG. 1, a flowchart of an embodiment of a method 100 for STI region formation a device including deep trench capacitors. In block 101 of FIG. 1, STI trenches are etched in an active region (for example, a top active silicon layer) of the device that includes deep trench capacitors that have metallic metal fill and/or plate electrode materials. The device that includes the deep-trench capacitors may be a DRAM device or a decoupling capacitor array in various embodiments. The STI trenches may be etched by reactive ion etching (RIE) in some embodiments. FIG. 2 shows a cross-section of an example DRAM device 200 after formation of STI trenches 204. DRAM device 200 includes a bottom substrate 201, which may comprise silicon, a buried oxide (BOX) layer 202, and a silicon-on-insulator (SOI) layer 203. The SOI layer 203 is covered with pad oxide layer 209 and pad nitride layer 210. Pad oxide and pad nitride layers serve as a hard mask during formation of the deep trenches (for the deep trench capacitors 208A-B) and STI trenches 204. The STI trenches 204 are etched in SOI 203, and extend to BOX layer 202. The deep trench capacitors 208A-B each include high-k dielectric 205, metal plate 206, an outer conductive plate 212, an optional center conductive material 207A and an optional plate electrode/strap conductive material 207B; these elements may comprise any of the materials discussed above. The high-k dielectric 205 and metal plate 206 that are located underneath an STI trench 204. High-k dielectric 205 may include hafnium oxide (HfOx) and/or hafnium silicate (HfSiO) in some exemplary embodiments, and metal plate 206 may include titanium nitride (TiN) in some exemplary embodiments. Outer conductive plate 212 forms a second electrode to trench capacitors 208A-B. Conductive plate 212 can be metal, partial metal, or non-metal such as highly doped Si. The second electrode may be common to all capacitors within an array and may be formed by doping a region of substrate 201. In some embodiments, the outer conductive plate 212 may additionally include metallic elements (not shown) disposed on the deep trench walls within a doped portion of substrate 201 and adjacent to high-k dielectric 205. Optional center conductive material 207A/207B may be any appropriate electrically conductive material. Center conductive material 207A/207B may be polysilicon in some embodiments, and may be doped with n-type dopants such as arsenic or phosphorus. Electrical contacts to the deep trench capacitors 208A-B for operation of the DRAM and/or decoupling capacitor array are made via the center conductive material 207A/207B and/or metal plate 206 (individual terminals) and via outer conductive plate 212, which is a common terminal. The distance 211 from the bottom of STI trench 204 to the metal plate 206 is about 100 nanometers (nm) or less in some embodiments. The STI trench formation process typically exposes high-k dielectric 205. When distance 211 is zero, the metal plate 206 is exposed by the STI trench formation process.

Figure 3:
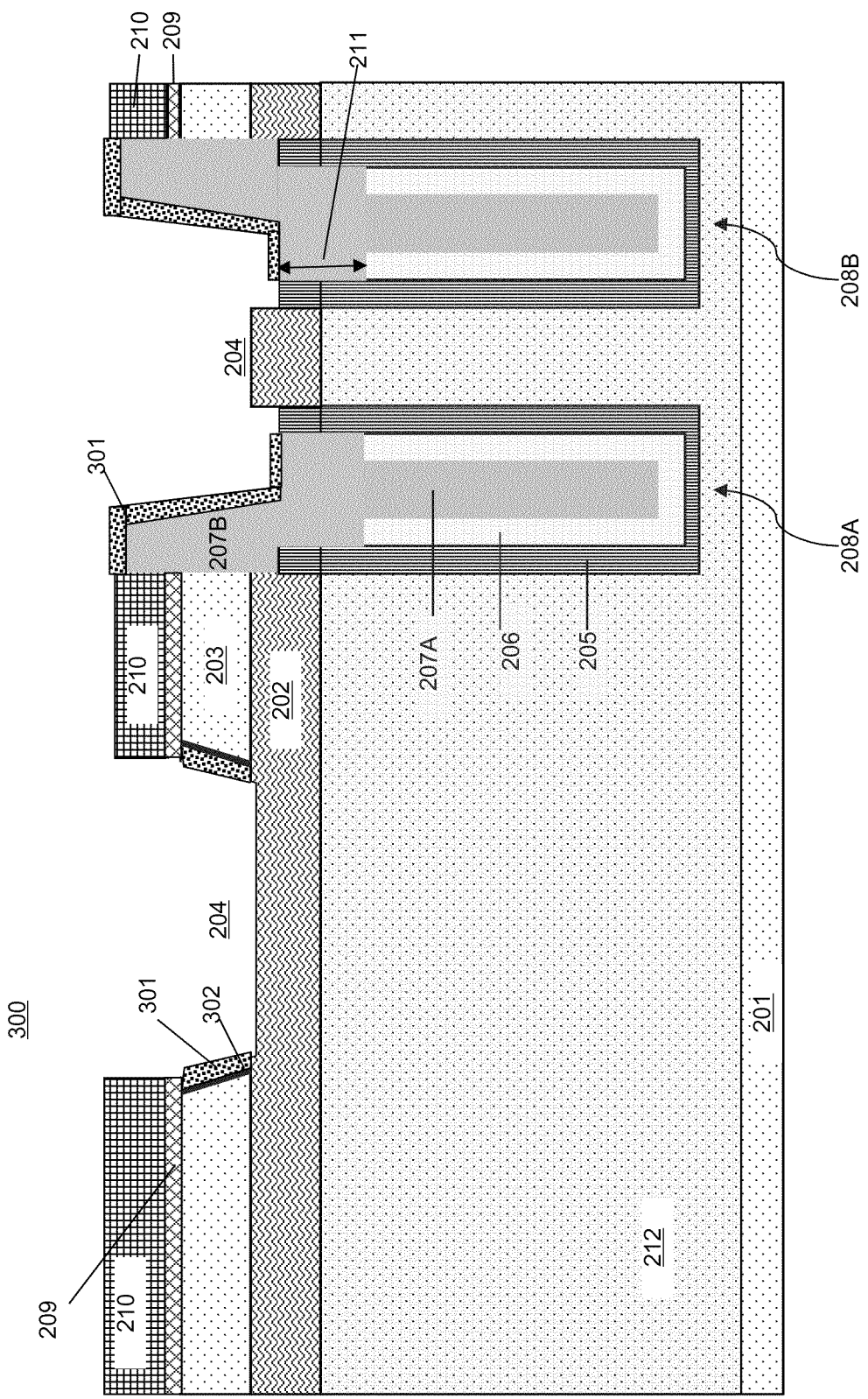
FIG. 3 is a cross-sectional view illustrating the DRAM device of FIG. 2 after formation of oxide liners by selective oxidation in the STI trenches.

Returning to method 100 of FIG. 1, after the STI trenches are etched in block 101, flow proceeds to block 102 of FIG. 1, in which STI oxide liners are formed on the walls of the STI trenches by low-temperature selective oxidation. The oxidation of block 102 is performed in a selective oxidation gas mixture comprising a mixture of oxidizing and reducing gases. The selective oxidation gas mixture includes from about 20% to about 1% of an oxidizing gas such as oxygen ($O_2$), and from about 80% to about 99% of a reducing gas such as hydrogen ($H_2$). Mixtures of from 10% to 5% of $O_2$ and 90% to 95% of $H_2$ may be used in some exemplary embodiments. The selective oxidation mixture may be diluted with a neutral carrier gas such as Helium (He) or Argon (Ar); the dilution ratio may be from about 0.1 to about 0.5 in various embodiments, and may be about 0.33 in some exemplary embodiments. The liner formation may be plasma-assisted, in which the diluted selective oxidation mixture is excited in plasma for an electrical discharge to form oxygen and hydrogen radicals that promote selective oxidation process at low temperatures. The neutral carrier gases serve the purpose of stabilizing electrical discharge. The plasma reactor may be a high density plasma (HDP) reactor operating with low substrate bias. Typical gas pressure range within the reactor is from about 10 milli-Torrs (mTorr) to about 100 mTorr and typical plasma electron density of from about 5e11 cm−3 to about 3e12 cm−3. The temperature of selective oxidation process is selected to provide desired oxidation selectivity with respect to metal plate material, and also to ensure high quality of silicon oxide/silicon interface. The process temperature may be from about 100° C. to about 500° C., or about 350° C. to about 450° C. in some exemplary embodiments. FIG. 3 shows a cross-section of the DRAM device 200 of FIG. 2 after formation of oxide liners 301 in the STI trenches 204 by low temperature selective oxidation. The oxide liners 301 are formed on exposed silicon-containing surfaces, specifically, the walls of STI trench 204 within silicon-on-insulator layer 203, forming optional silicon-liner interface 302 between oxide liners 301 and silicon-on-insulator layer 203. The silicon-liner interface 302 has a low density of interfacial traps at near silicon mid-bandgap energy level as measured by the $D_{it}$ parameter. The $D_{it}$ parameter of silicon-liner interface 302 may be less than about 3e12 cm$^{-2}$eV$^{-1}$ and, more preferably, from about 1e11 cm$^{-2}$eV$^{-1}$ to about 1e12 cm$^{-2}$eV$^{-1}$. Silicon-liner interface 302 ensures a low recombination-generation junction leakage current for transistor junctions isolated by STI trenches 204; a relatively low junction leakage current allows proper operation of low-power transistors such as array access transistor of the DRAM cells. The selective nature of the oxidation process prohibits formation of the oxide liner 301 on or within the metal plate 206 and reduces process interaction with high-k dielectric 205. The high-k dielectric 205 may conduct oxygen and hydrogen molecules, radicals, and ions, allowing for substantial diffusion of these chemically active species over relatively long distances of up to a few hundred nanometers (nm). These chemically active species may interact with the metal plate 206 or any metallic material that maybe present in the outer conductive metal plate 212, resulting in undesirable oxidation and delamination of these materials. Low-temperature selective oxidation process suppresses diffusion of these species in high-k dielectric 205, and further eliminates oxidation and delamination of metal plate 206 within 100 nm of the STI trench 204. Suppression of oxidation and delamination of metal plate 206 and high-k dielectric 205 leads to a low resistance of metal plate 206 and a reduced number of structural defects such as dislocations and stacking faults in the adjacent outer conductive metal plate 212 and silicon-on-insulator layer 203, leading to a relatively high performance of DRAM/eDRAM cells and less geometrical distortions within substrate 201 after formation of oxide liners 301 and subsequent high-temperature processing. In some embodiments, the STI liner may be annealed after formation in a neutral or nitridizing ambient (for example, $N_2$ or $NH_3$) at a temperature of about 800° C. or higher to further improve interfacial quality.

Figure 4:
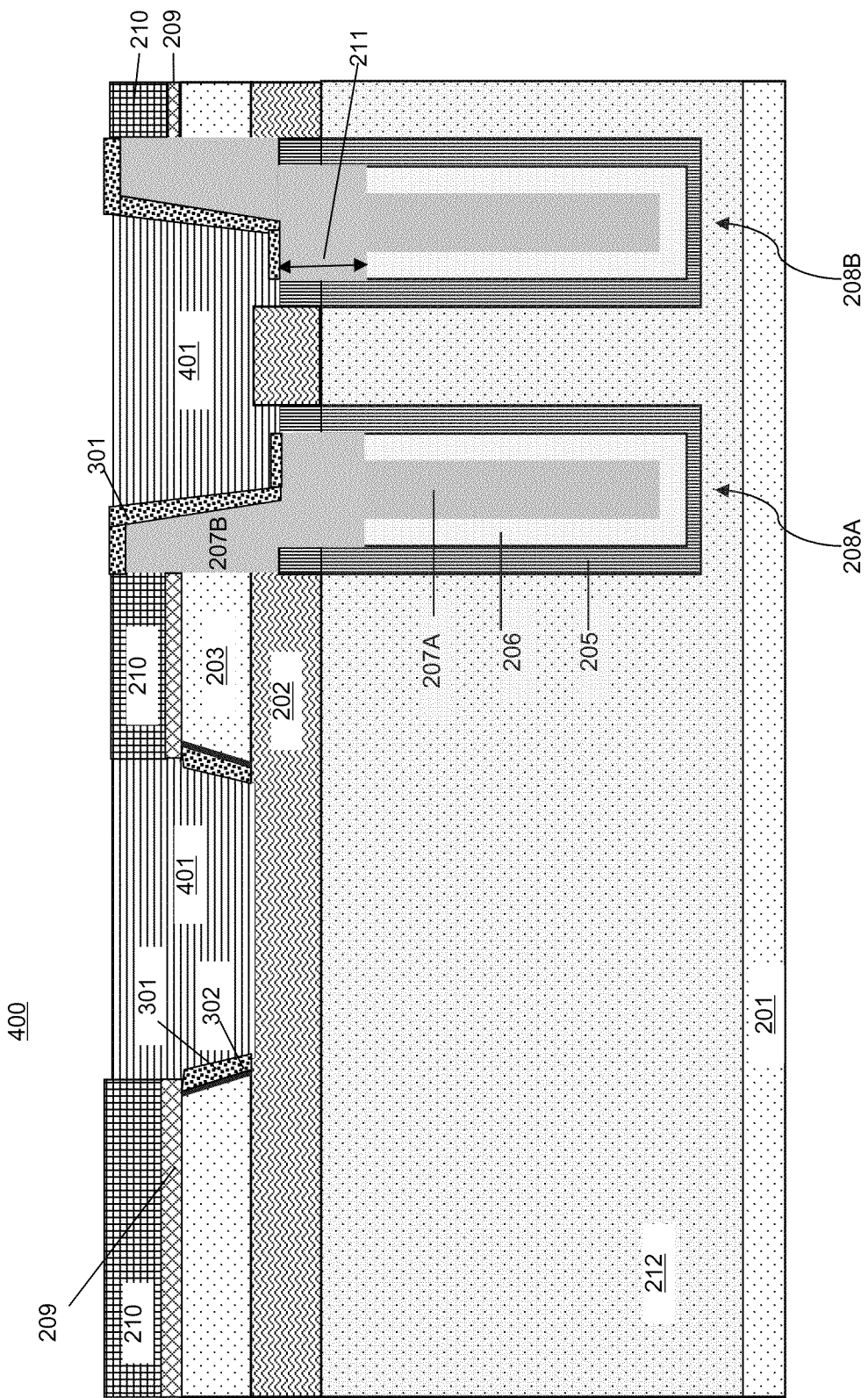
FIG. 4 is a cross-sectional view illustrating the DRAM device of FIG. 3 after formation of oxide fill in the lined STI trenches to form STI regions.

Turning again to method 100 of FIG. 1, in block 103, an oxide fill is deposited in the selectively oxidized STI trenches over the oxide liners 301. FIG. 4 shows a cross-section of the DRAM device 300 of FIG. 3 after formation of oxide fill 401 over the oxide liners 301 in the STI trenches 204. The oxide fill 401 may optionally be formed by an oxygen delay deposition technique in some embodiments, which is discussed in further detail below. In other embodiments, the oxide fill 401 may be formed using standard oxide deposition techniques. Device 400 includes deep trench capacitors 208A and 208B, which are electrically isolated from each other, and from other devices (not shown) in the device 400, by STI regions comprising oxide liner 301 and oxide fill 401.

Because the metal plate 206 and high-k dielectric 205 may still be exposed at the beginning of the oxide fill deposition step that is performed in block 103 of FIG. 1, the metal plate 206 and high-k dielectric 205 may be oxidized during early stages of the oxide fill deposition process. To reduce such unwanted oxidation, in some embodiments, the oxide fill 401 may be deposited using an oxidation delay deposition technique. Deposition of a silicon oxide fill may be performed using two or more precursors, with first precursor being a source of silicon such as silane ($SiH_4$) and the second precursor being a source of oxygen such as molecular oxygen $O_2$. While alternative precursors can be used as sources for both silicon and oxygen, these precursors can be generally classified as silicon-containing and oxidizing, respectively. In oxidation delay deposition, the area in which the oxide fill is being deposited is initially exposed to a first silicon-containing precursor for an oxidation delay time period. After expiration of the oxidation delay time period, the oxidizing precursor is introduced and mixed with the first precursor to form the oxide fill. The oxygen delay time period may vary from about fraction of a second to a few seconds in various embodiments, for example from about 0.5 to about 5 seconds. The oxidation delay time period allows the first precursor to coat surfaces on which oxidation is undesirable (e.g., high-k dielectric 205 and metal plate 206) before the oxidizing precursor is introduced, reducing unwanted oxidation. Accordingly, the oxidation delay time period is preferably selected to allow coating of the surface of metal plate 206 and high-k dielectric 205 with at least one monolayer of silicon, for example from about 0.5 nm of Si to about 2 nm of Si. Upon introducing the oxidizing precursor, some or all of the silicon protective coating is converted into silicon oxide ($SiO_2$). The thickness of the protective silicon coating after conversion to silicon oxide may be about 1 nm. If the protective silicon coating is substantially thicker than 1 nm, it will be only partially converted to $SiO_2$, leaving behind a silicon-rich interfacial layer. Presence of such Si-rich interfacial layer between oxide liner 301 and oxide fill 401 is undesirable because it may alter electrical characteristics of adjacent transistors and other devices that maybe present in the active region comprising SOI layer 203. However, if protective silicon coating is substantially thinner than about 1 nm it may not be effective in protecting metal plate 206 and high-k dielectric 205. To ensure absence of silicon-rich layer in between oxide liner 301 and oxide fill 401 while protecting metal plate 206 and high-k dielectric 205, the oxidation delay deposition technique may be enhanced by inserting an additional selective oxidation step after expiration of oxidation delay time but before starting deposition of the oxide fill. The duration of such additional oxidation step may be selected such that all silicon protective coating is converted into $SiO_2$. In some deposition reactors, this can be accomplished in-situ by switching off or reducing flow of Si-containing precursor (e.g. $SiH_4$) while providing a selective oxidation ratio of the oxidizing precursor (e.g. $O_2$) to hydrogen gas ($H_2$) by selecting proper flow rate ratio between $O_2$ and $H_2$ gases (e.g. 1/10). The deposition reactor may be a high density plasma (HDP) reactor, which may be similarly used for the selective liner oxidation of block 102 of FIG. 1. In a HDP reactor, oxide fill deposition may be conducted in the presence of hydrogen, argon, and helium at a high substrate bias to ensure proper gapfill into STI trench 204. In such a reactor, the duration of the additional selective oxidation step used to form the oxide fill 401 in block 103 is from about 0.5 to about 10 seconds. Similar to the liner deposition of block 102, the additional selective oxidation step of block 103 may convert from about 1 nm to about 1.5 nm of Si into from about 2 nm to about 3 nm of SiO2 without oxidizing high-k dielectric 205 and metal plate 206. In addition to the ability to perform block 102 (selective liner oxidation) and block 103 (oxide fill deposition) in a single process reactor, a HDP reactor also simplifies the implementation of the oxidation delay deposition technique by allowing a multiple step recipe with proper gas flow ratios. The oxide delay deposition technique described above is optional; in some embodiments, regular oxide deposition techniques may be used to form oxide fill 401.

After completion of the STI formation process as described by method 100 of FIG. 1, front-end-of-the-line (FEOL) processes are performed on device 400 of FIG. 4 to form a final device, which may comprise DRAM or a decoupling capacitor array in various embodiments. These may include polishing, removal of pad nitride and pad oxide 209/210, and forming gate dielectric, transistors gates, transistor spacers, transistor junctions, silicided areas, and/or contact studs. Transistor junction formation may include multiple millisecond annealing steps. During formation of transistor contacts, the contact to the buried outer conductive metal plate 212 is also formed by first etching a trench to the buried plate and then performing transistor spacer formation, silicidation, and stud formation processes. The access transistor to a trench capacitor that is part of a DRAM or eDRAM array may connect to trench capacitors 208A-B via silicided straps. In the case of a device in which the trench capacitors 208A-B comprise decoupling capacitors, the contact to trench capacitors 208A-B may be made directly. Use of method 100 of FIG. 1, including selective liner oxidation and oxide fill delay deposition, to form STI regions in a device comprising DRAM or decoupling capacitors allows from about 3 to about 24 millisecond anneals to be performed, as necessary, without accumulation of wafer bow and distortion in the device.

The technical effects and benefits of exemplary embodiments include reduced electrical leakage between electrical elements isolated by STI regions and/or capacitive elements to reduce power consumption and improve memory retention time, lower resistance of metal fill/plate elements to improve device performance, and reduced warping caused by STI formation and subsequent thermal processing to improve process yield.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for formation of a shallow trench isolation (STI) region in an active region of a device comprising trench capacitive elements, the trench capacitive elements comprising a metal plate and a high-k dielectric, the method comprising:
    etching a STI trench in the active region of the device, wherein the high-k dielectric of the trench capacitive elements is exposed by the etching of the STI trench, and the high-k dielectric of the trench capacitive elements comprises a first portion of a surface of the STI trench; and
    forming an oxide liner on a second portion of the surface of the STI trench, wherein the oxide liner is formed selectively to the exposed high-k dielectric such that the oxide liner is not formed on the exposed high-k dielectric, and wherein forming the oxide liner is performed at a temperature of about 600° C. or less.

2. The method of claim 1, wherein forming the oxide liner in the STI trench is performed in a high density plasma (HDP) reactor.

3. The method of claim 1, wherein the oxide liner is formed using an oxidation gas that comprises from about 1 percent (%) to about 20% or less of an oxidizing gas and from about 80% to about 99% of a reducing gas.

4. The method of claim 3, wherein the oxidizing gas comprises one of oxygen (O2), water (H2O), nitrous oxide (N2O), or ozone (O3), and wherein the reducing gas comprises one of hydrogen (H2), ammonia (NH3), and silane (SiH4).

5. The method of claim 3, wherein the oxidation gas further comprises a neutral carrier gas comprising one of Argon (Ar), Helium (He), Neon (Ne), Xeon (Xe), or Nitrogen (N2).

6. The method of claim 3, further comprising exciting the oxidation gas in plasma before forming the oxide liner in the STI trench.

7. The method of claim 1, wherein the oxide liner is formed at a temperature from about 100° to about 450° C.

8. The method of claim 1, further comprising annealing the oxide liner in a nitrogen-containing ambient at a temperature of about 800° C. or higher before forming the oxide fill.

9. The method of claim 1, further comprising forming an oxide fill over the oxide liner using an oxidizing precursor delay deposition technique, comprising:
   exposing the STI trench to a first non-oxidizing precursor for an oxidation delay time period, wherein a first fill layer is formed in the STI trench and directly on the exposed high-k dielectric by the first non-oxidizing precursor; and
   after elapsing of the oxidation delay time period, mixing an oxidizing precursor with the first non-oxidizing precursor to oxidize the first fill layer and to deposit the oxide fill.

10. The method of claim 9, further comprising annealing the device after formation of the oxide fill, the annealing comprising multiple millisecond exposures.

11. The method of claim 1, further comprising:
   exposing the metal plate of the trench capacitive elements by the etching of the STI trench, wherein the metal plate of the trench capacitive elements comprises the first portion of the surface of the STI trench; and
   forming the oxide liner selectively to the exposed metal plate, such that the oxide liner is not formed on the exposed metal plate.

12. The method of claim 1, wherein the trench capacitive elements comprise:
   the high-k dielectric, the high-k dielectric located on a surface of a trench located in a conductive plate;
   the metal plate, the metal plate located in the trench in the conductive plate on a surface of the high-k dielectric; and
   a center conductive material located in the trench in the conductive plate on a surface of the metal plate, wherein the center conductive material is exposed by the etching of the STI trench and comprises the second portion of the surface of the STI trench, and the oxide liner is formed directly on the center conductive material.

13. The method of claim 12, wherein the conductive plate is located on top of a silicon substrate and underneath a buried oxide layer, such that the high-k dielectric is in direct contact with the buried oxide layer.

14. A method for formation of a shallow trench isolation (STI) region in an active region of a device comprising trench capacitive elements, the trench capacitive elements comprising a metal plate and a high-k dielectric, the method comprising:
   etching a STI trench in the active region of the device, wherein the high-k dielectric of the trench capacitive elements is exposed by the etching of the STI trench, and the high-k dielectric of the trench capacitive elements comprises a portion of a surface of the STI trench; and
   forming an oxide fill in the STI trench using an oxidizing precursor delay deposition technique, comprising:
      exposing the STI trench to a first non-oxidizing precursor for an oxidation delay time period, wherein a first fill layer is formed in the STI trench and directly on the exposed high-k dielectric by the first non-oxidizing precursor; and
      after elapsing of the oxidation delay time period, mixing an oxidizing precursor with the first non-oxidizing precursor to oxidize the first fill layer and to deposit the oxide fill.

15. The method of claim 14, wherein the first fill layer comprises a silicon layer having a thickness from about 0.5 nanometers (nm) to about 2 nm before oxidation of the first fill layer, and wherein the oxidation of the first fill layer forms a silicon oxide layer having a thickness of about 1 nm or less.

16. The method of claim 14, wherein the first non-oxidizing precursor comprises silane (SiH4), and wherein the oxidizing precursor comprises oxygen (O2) and hydrogen gas (H2).

17. The method of claim 14, wherein the delay time period is from about 0.5 to about 5 seconds.

18. The method of claim 14, wherein forming the oxide fill using the oxidizing precursor delay deposition technique is performed in a high density plasma (HDP) reactor.

19. The method of claim 18, wherein forming an oxide liner in the STI trench is performed in the HDP reactor before forming the oxide fill using the oxidizing precursor delay deposition technique in the HDP reactor.

20. The method of claim 14, further comprising
   exposing the metal plate of the trench capacitive elements by the etching of the STI trench, wherein the metal plate of the trench capacitive elements comprises a portion of a surface of the STI trench; and
   wherein forming the oxide fill in the STI trench using an oxidizing precursor delay deposition technique further comprises forming the first fill layer directly on the exposed metal plate by the first non-oxidizing precursor.

* * * * *